(12) United States Patent
Nozuyama

(10) Patent No.: US 6,567,946 B1
(45) Date of Patent: May 20, 2003

(54) EVALUATION DEVICE OF WEIGHTED FAULT COVERAGE AND EVALUATION METHOD OF THE SAME

(75) Inventor: Yasuyuki Nozuyama, Inagi (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/532,882

(22) Filed: Mar. 22, 2000

(30) Foreign Application Priority Data

Mar. 23, 1999 (JP) .......................................... 11-077428

(51) Int. Cl.$^7$ ................................................ G06F 11/00
(52) U.S. Cl. ...................................... 714/741; 714/724
(58) Field of Search ................................. 714/724, 741

(56) References Cited

U.S. PATENT DOCUMENTS 4,769,817 A * 9/1988 Krohn et al. ............... 714/724
6,308,293 B1 * 10/2001 Shimono ..................... 714/741

* cited by examiner

*Primary Examiner*—Phung M Chung
(74) *Attorney, Agent, or Firm*—Finnegan, Henderson, Farabow, Garrett & Dunner, L.L.P.

(57) ABSTRACT

The present invention provides evaluation device and evaluation method of weighted fault coverage useful for creation of test patterns of high fault coverage corresponding to manufacturing quality of LSI at high precision. In the evaluation device and evaluation method of fault coverage of the present invention, in a large scale integration such as system LSI, in order to utilize the results of fault simulation or ATPG in improvement of quality in the manufacturing field, the faults assumed in logic connection nodes and input and output terminals of the internal basic cell are weighted in relation to various data relating to fault occurrence extracted from the actual layout data, and the weighted fault coverage is calculated from the result of fault simulation or ATPG by using them. Accordingly, at an early stage of a manufacturing process, the fault coverage for faults of high occurrence is obtained with high precision, and by adding the test patterns so as to enhance the weighted fault coverage, the manufacturing quality of LSI can be enhanced efficiently.

18 Claims, 5 Drawing Sheets

24: NMOS FORMATION REGION
25: PMOS FORMATION REGION
26: GATE ELECTRODE
27: DRAIN ELECTRODE
28: $V_{SS}$ POWER SOURCE LINE
29: $V_{DD}$ POWER SOURCE LINE
30~33: CONTACTS

41: BIDIRECTIONAL WIRING    43: TRI-STATE BUFFER
42: INVERTER                44: BIDIRECTIONAL WIRING REGION

EVALUATION DEVICE OF WEIGHTED FAULT COVERAGE AND EVALUATION METHOD OF THE SAME

CROSS-REFERENCE TO RELATED APPLICATION

This application is based upon and claims the benefit of priority from the prior Japanese Patent Application No. 11-077428, filed Mar. 23, 1999, the entire contents of which are incorporated herein by reference.

BACKGROUND OF THE INVENTION

The present invention relates to a fault coverage evaluation device of a logic circuit and an evaluation method thereof, and more particularly to testing technology of logic LSI, VLSI and the like, fault grading technology including fault simulation technology, and technology for enhancing quality of manufacturing products.

In a prior art of fault coverage evaluation device and evaluation method, proper faults are assumed in inner nodes in an LSI or its inner logic circuit, it is calculated how many faults can be detected by test patterns for testing operation of the LSI by employing the fault simulation technology, and the fault coverage of the test patterns is evaluated.

In particular, the fault simulation in which a stuck-at fault being the inner node fixed at 0 or 1 is an assumed fault is relatively easy in calculation, and it is known that the obtained fault coverage has a strong correlation with the rate of defective LSI chips mixed in those judged as good (defect free) after selection by using the test patterns, or the defective chip rate occurring in the market after shipping of LSI chips.

Therefore, if the fault coverage of test patterns is low, a high fault coverage may be achieved by adding or improving the test patterns, so that the shipping quality of LSI may be enhanced somewhat. However, since this correlation is not always strict, a very high fault coverage is demanded if a sufficiently high manufacturing quality is desired to be maintained.

On the other hand, the test patterns are generally added or improved manually on the basis of the experience, and in order to achieve a certain high fault coverage, a very long period is needed, and to obtain a sufficiently high manufacturing quality, a more advanced testability design method must be employed.

In the testability design method, however, the test patterns were hitherto generated automatically by, for example, an ATPG (automatic test pattern generator), and by using them, or by using test patterns improved by adding them to the original test patterns, the LSI and its inner logic circuit was tested, but the principle was a method of evaluating the fault coverage of the test patterns by assuming the faults stuck-at "0" or "1" commonly in inner nodes, and it requires much more additional circuits for testing or an enormous CPU time in order to obtain a fault coverage above a certain level, and in spite of such immense cost, sometimes sufficiently high manufacturing quality could not be achieved.

In the conventional evaluation of fault coverage, the reason why the correlation is not expected above a certain level will be explained below. In an actual LSI, portions corresponding to logic connection nodes for mutually connecting input and output terminals of the internal basic cells, and input terminal and output terminal of internal basic cells (hereafter called logic connection nodes unless otherwise specified, and such input terminal and output terminal including bidirectional terminal) are widely varied, including those having short wiring or long wiring in layout, having many connecting portions composed of a single contact, more specifically a single minimum-size contact, and not containing such connecting portions at all.

Herein, a basic cell refers to a logic circuit performing a basic logic operation, including a single device as a minimum unit and the one performing relatively complicated logic operation.

On the other hand, in a premature process, until stabilized at a level of high yield, faults of specific modes may occur frequently, such as open fault of contact and short-circuit fault. In such circumstance, therefore, the actual fault occurrence rate differs in each logic connection node.

In the conventional fault simulation, however, faults stuck at either "0" or "1" only were assumed for each logic connection node, and the fault coverage was determined only in terms of rate of detection of faults by predetermined test patterns.

Accordingly, in the conventional fault simulation, it was extremely difficult to point out problems in the manufacturing process by comparing the results of tests of an LSI fabricated by the manufacturing process and the fault simulation result of the LSI, in a sense that which mode of fault is most likely to occur.

As clear from the description herein, moreover, in the existing fault simulation, basically, in logic connection nodes of the LSI, only two faults stuck at 0 and 1 are assumed commonly, it cannot cope with problems that the fault occurrence rate varies in each logic connection mode when the manufacturing process or the shape of layout pattern differs.

If the manufacturing process or the shape of layout pattern differs, however, it is highly possible that the fault occurrence rate varies in the logic connection nodes, and in the conventional fault simulation, it was completely ignored that the amount of layout related parameter information closely related to the occurrence of fault fluctuates in each logic connection node.

Herein, the layout related parameter information is the constituting elements of layout data to be extracted in relation to the fault assumed in the logic connection nodes of notice, from the layout information of the objective LSI, and the constraints and rules for determining such elements.

More specifically, the layout related parameter information includes layout information related to the occurrence rate of faults, for example, the length of wiring, number of connecting portions composed of a single minimum-size contact.

The amount of layout related parameter information is the amount or value determined according to the information on the layout, and it is the basis for determining the weighting amount relative to occurrence of fault given to each logic connection node of notice. The amount of layout related parameter information is more specifically described in the embodiments of the present invention.

Thus, in the conventional fault simulation, since no consideration was given to the correspondence between the fault assumed in each logic connection node and the portion likely to cause fault actually in layout, in order to improve the manufacturing quality of LSI, the test pattern designer was forced to add test patterns only for the purpose of achieving an assigned level of fault coverage, and in spite of an tremendous resource investment, substantially, it was difficult to prepare test patterns of high quality timely at the early stage of mass production when effects of high fault coverage are most likely to be obtained.

BRIEF SUMMARY OF THE INVENTION

As described above, in the conventional fault coverage evaluation device and evaluation method, since consideration was not given to the correspondence between the fault assumed in each logic connection node and the portion likely to cause fault actually in layout, despite an tremendous resource investment, there was a problem that test patterns of high quality could not be prepared.

The present invention is devised in order to solve these problems, and it is hence an object thereof to provide an evaluation device of weighted fault coverage and an evaluation method thereof capable of preparing test patterns of high quality in a short period by a small resource investment, and greatly contributing to improvement of manufacturing quality of LSI at the early stage of mass production when effects of high fault coverage are likely to appear, by setting up correspondence between the amount of layout related parameter information closely relating to occurrence of fault and the logic connection nodes.

In the evaluation device and evaluation method of weighted fault coverage of the present invention, in a large scale integration (LSI) such as system LSI, in order to feed back the result of fault simulation to quality improvement truly in the manufacturing field, each fault assumed in each logic connection node is weighted in relation to the variety of information related to occurrence of fault extracted from actual layout information, and by using the weighted amount and the conventional fault simulation result, the weighted fault coverage is calculated.

More specifically, the evaluation device of fault coverage of the present invention comprises a weighted fault list generator for outputting a weighted fault list of a logic circuit by receiving input information, that is, logic connection information of the logic circuit, layout information of the logic circuit, and layout related parameter information to be extracted from the layout information related to the faults determined from the logic connection information, the faults being assumed in the logic connection nodes for connecting input and output terminals of the internal basic cells including at least input and output terminals of the logic circuit.

Preferably, in the evaluation device of fault coverage, the fault obtained from the logic connection information is at least composed of the fault assumed in any one of the logic connection node, input terminal of the basic cell inside the logic circuit, and the output terminal of the basic cell inside the logic circuit terminal.

Preferably, the evaluation device of fault coverage further comprises a calculator for weighted fault coverage and others, after executing fault simulation or ATPG by inputting the logic connection information of the logic circuit, test patterns for the logic circuit and the weighted fault list to a fault simulator or an ATPG tool, outputting at least the weighted fault coverage of the logic circuit by receiving the obtained weighted fault detection information list of the logic circuit as input information.

The calculator may be also designed to output various analytical information on undetected faults for facilitating addition and creation of test patterns for effectively decreasing the undetected faults.

The evaluation method of fault coverage of the present invention comprises the steps of; outputting a weighted fault list of a logic circuit by inputting logic connection information of the logic circuit, layout information of the logic circuit, and layout related parameter information to be extracted from the layout information related to the fault determined from the logic connection information, the fault being assumed at least in the logic connection node for connecting input and output terminals of the internal basic cell including the input and output terminal of the logic circuit, into weighted fault list generation means; outputting a weighted fault detection information list by executing a fault simulation or ATPG by inputting the logic connection information of the logic circuit, test patterns for the logic circuit, and the weighted fault list to a fault simulator or an ATPG tool; and outputting at least weighted fault coverage and others of the logic circuit by inputting the weighted fault detection information list to a calculator for weighted fault coverage and others.

Preferably, in the evaluation method of fault coverage, the fault obtained from the logic connection information is at least composed of the fault assumed in any one of the logic connection node, input terminal of the basic cell inside the logic circuit, and the output terminal of the basic cell inside the logic circuit.

Thus, in the manufacturing process of LSI at the beginning of mass production, concerning the fault simulation results for the process steps likely to cause faults, since the fault coverage can be determined in a weighted form by the layout related parameter information, the fault coverage about faults of high occurrence in the initially starting process can be obtained, and by adding the test patterns further to enhance the weighed fault coverage, the manufacturing quality of LSI can be efficiently enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A, 3B, and 3C are diagrams showing a dividing manner of layout regions for input and output terminals of CMOS inverter, in which FIG. 3A shows logic connection of gate level, FIG. 3B shows logic connection of device level, and FIG. 3C shows logic connection of layout level.

FIGS. 5A and 5B are diagrams showing overlapping cases of layout regions corresponding to plural output terminals, in which FIG. 5A shows a latch circuit, and FIG. 5B shows a general case of overlapping of layout regions.

FIGS. 6A and 6B are diagrams showing the manner of determining the layout related parameter information in the case of faults assumed in the input terminals of basic cells, in which FIG. 6A shows the output terminal of basic cell A being connected to input terminals of basic cells B, C, D, and FIG. 6B shows an actual layout of wiring portion.

DETAILED DESCRIPTION OF THE INVENTION

Figure 1:
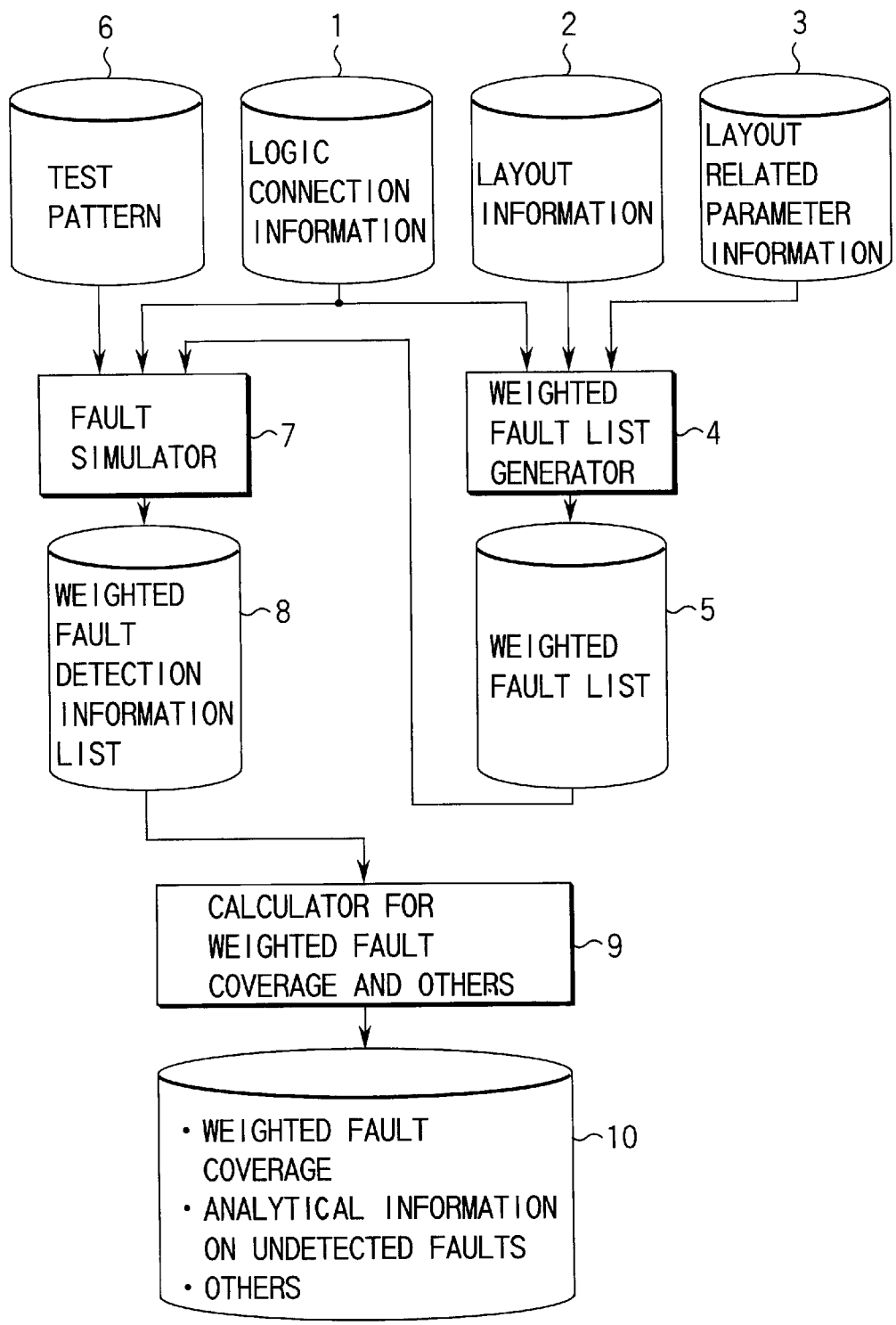
FIG. 1 is a flowchart showing evaluation device and evaluation method of fault coverage relating to first and second embodiments.

Referring now to the drawings, embodiments of the present invention are described in detail below. FIG. 1 is a diagram showing an evaluation device of weighted fault coverage relating to a first embodiment of the present invention. The existing fault simulation is applied to the logic connection net of the gate level composed of mutually connecting wiring, including plural basic cells inside the logic circuit to be detected and input and output terminals of the logic circuit, and therefore the logic connection net of the gate level is described herein. Actually, the connection net of device level may be also combined, but the principle of the present invention may be applied in such a case, too.

In a near future, it is also possible that fault simulation may be applied in a logic connection net described in HDL (hardware description language), and in this case a fault may be assumed on a logic connection node (wire) on the net. In such a case, too, the principle of the present invention may be easily applied.

An evaluation device of fault coverage of the first embodiment comprises a weighted fault list generator 4 for weighting a fault assumed in each connection node of a logic connection net by receiving input information, that is, logic connection information 1 of the logic circuit or LSI composed of the logic connection net, layout information 2 relating to the layout pattern, and layout related parameter information 3 composed of constituting elements of layout data to be extracted from the layout information related to the fault assumed in the logic connection node or the like, or constraints and rules (minimum pitch, minimum size and the like) for determining these elements. The fault determined by this weighted fault list generator 4 is output from the weighted fault list generator 4 as a weighted fault list 5.

Next, by inputting the logic connection information 1, a test pattern 6 which is the object of evaluation of fault detection capability, and the weighted fault list 5 into a conventional fault simulator 7, a weighted fault detection information list 8 is output. In this section, when the "weight" portion of the weighted fault list 5 is designed to be handled as "comment" (ignored) in the fault list for the fault simulator, it may be executed same as the conventional fault simulation.

If such manner is difficult, the weighted fault list 5 may be divided using a program into the "weight" portion and other portion (actually, a fault list not weighted so as to be interpreted by the fault simulator 7), and only the latter portion may be fed into the fault simulator 7, and the "weight" may be added to the fault detection information list as a result of fault simulation. Anyway, such kind of process is also included in the category of the present invention.

The evaluation device of fault coverage of the first embodiment also includes a calculator for weighted fault coverage and others 9 for receiving the weighted fault detection information list 8, and outputting output information 10 composed of weight fault coverage and others.

Herein, the weighted fault detection information list 8 includes various detection levels of faults assumed in the logic circuit, from "detection" to situation dependent detection usually called "potential detection", and "undetected" by the applied test patterns.

The output information 10 composed of weighted fault coverage and others usually include the weighted fault coverage composed of "detected" cases only, and the weighted fault coverage including potential detection as well as detected cases. Weighted fault coverage of each logic block in the logic circuit is also included in the output information 10. Further, for the ease of addition of test pattern for effectively decreasing undetected faults, for example, it may also include undetected fault analysis information of various types such as logic block classified display of undetected faults in the logic circuit and display of weighted faults according to weight.

As mentioned above, the evaluation device of fault coverage of the first embodiment comprises the weighted fault list generator 4 and calculator for weighted fault coverage and others 9 as main components, and has a function of extracting the amount of the data of layout elements or that among layout elements closely relating to individual fault occurrence according to the layout related parameter information 3, and generating the weighted fault list 5 having said amount of data added to the conventional fault list, that is, weighted according to the possibility of occurrence of fault, and a function of calculating the weighted fault coverage and others from the weighted fault detection information list 8 obtained by fault simulation using the fault list 5.

When the output information 10 composed of thus obtained weighted fault coverage and furthermore undetected fault analysis information is used in the evaluation of fault detection capability of test patterns, the fault detection capability of the test patterns can be evaluated concerning the faults closely corresponding to the fault or defect modes of actual LSI, and hence it is possible to add test patterns for enhancing the fault coverage by aiming at detection of fault or defect modes in the actual LSI, so that the resource may be saved substantially.

As a second embodiment, an evaluation method of fault coverage of the present invention is described specifically below by referring again to FIG. 1. First, in the logic circuit of the LSI to be evaluated, the logic connection information 1 storing the information of the logic connection nodes on the logic connection net composed by connection between input and output terminals of the internal basic cells including its input and output terminals, and input terminals and output terminals of the basic cells in the logic circuit, and the layout information 2 storing the layout data of the logic circuit are correlated to each other on the layout.

On the other hand, the layout related parameter information 3 is also prepared, which stores, for example, the length of the wiring portion of minimum pitch in the distance between adjacent wires in the layout data, the number of portions connected by the contact of minimum size only, layout elements likely to cause faults or defects and corresponding to the faults assumed in logic connection nodes, their combination, and information about constraints and rules for determining them.

Recently, in the layout data of LSI, a method is attempted to estimate the layout portion likely to cause faults or defects by scattering dust of various particle sizes at random, and this method may be employed in creation of the layout related parameter information 3.

On the basis of this layout related information 3, the amount of layout related parameter information corresponding to the faults assumed in logic connection nodes is extracted from the layout information 2 by using the weighted fault list generator 4 explained in the first embodiment. The thus obtained amount of layout related parameter information is used as the weighting amount of a fault assumed in each logic connection node, and the weighted fault list 5 of assumed fault is created.

Next, by inputting the test patterns 6 which are the object of fault coverage evaluation, the logic connection information 1 and the weighted fault list 5 into a conventional fault simulator 7, the fault simulation is executed, and the weighted fault detection information list 8 relating to the fault assumed in the logic connection node is output.

Using the data of this weighted fault detection information list 8, the weighted fault coverage by the test patterns is determined, and further, as required, undetected fault analysis information of various types is created for the ease of addition of test patterns for effectively decreasing undetected faults. These pieces of output information are output from the calculator for weighted fault coverage and others 9 as explained in the first embodiment.

Figure 2:
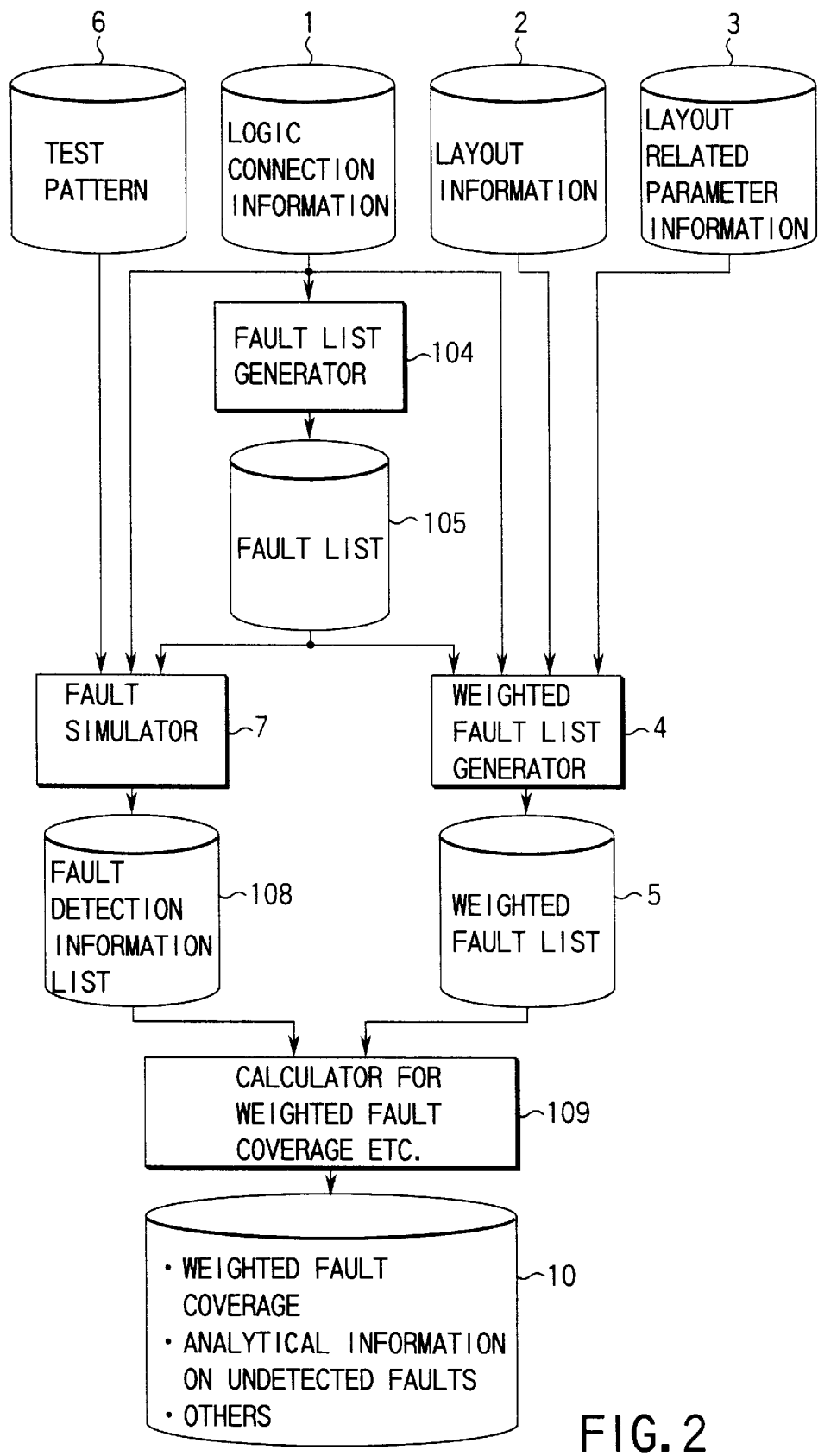
FIG. 2 is a flowchart showing evaluation device and evaluation method of fault coverage relating to a third embodiment.

A third embodiment of the present invention is described while referring to FIG. 2. What differs from the foregoing first and second embodiments is that fault simulation is executed by using a fault list 105 (without weight information) generated from a fault list generator 104 attached as a peripheral device to the conventional fault simulator usually as the fault list.

The weighted fault list 5 in the diagram at least includes the weight information of each fault shown in the fault list 105, extracted from the layout information 2 of the logic circuit according to the layout related parameter information 3. A calculator for weighted fault coverage and others 109 receives a fault detection information list 108 by the conventional fault simulator without weight information, and the weighted fault list 5, and outputs output information 10 composed of weighted fault coverage and undetected fault analysis information.

This embodiment is to add this invention merely to the conventional fault simulation environment, and is easiest to realize, but it must be noted that problems may occur if attempted to realize a fault sampling technique which is one of the important techniques for high speed of fault simulation.

The fault sampling technique is a method of extracting faults in a logic circuit to be evaluated randomly, executing fault simulation with them, and determining the fault coverage by permitting a certain statistic error, and it can substantially reduce the CPU time required for fault simulation.

If attempted to realize the fault sampling technique in the present invention, from the viewpoint of assuring the randomness, it is preferred to execute fault sampling in consideration of the weight extracted from the layout information preliminarily, but in this embodiment, fault sampling is done on the fault list 5 not having weight information, and the error is increased by fault sampling.

Therefore, if considering also the use of fault sampling technique, it is preferred to employ the first and second embodiments. The fault sampling method of weighted fault includes, for example, a method of adding weights of all faults, defining the range of values before and after adding each fault weight as the fault, dividing by the total sum to normalize, then generating uniform random numbers between 0 and 1, sequentially picking up faults one by one corresponding to the range including each random number value.

Usually, at semiconductor device manufacturers, in the manufacturing process likely to cause faults or defects, the fault or defect mode is analyzed specifically by using a process TEG (test element group) aiming at experimentally reproducing and confirming the mode. Also, as mentioned above, recently, by randomly scattering dust of various particle sizes, the layout portion likely to cause faults or defects is estimated, and such portion is corrected, and the semiconductor devices are manufactured.

Anyway, before starting mass production in the manufacturing factory of semiconductor devices, weak points of the manufacturing process, that is, problems likely to occur are preliminarily analyzed, and the present invention is effectively utilized in such cases.

Incidentally, weighting for logic connection node likely to cause faults or defects is not always required to be in a proportional relation to the amount of layout related parameter information concerning the node, but when the layout related parameter having an obvious effect on the yield is known, for example, the weighting amount may be set at x-th power of the amount of the layout related parameter information.

It may include, for example, aside from integers such as 1, 2 and 3, fraction such as $\frac{1}{2}$, $3/2$ and $5/2$, and decimals such as 0.3 and 1.8, and negative numbers such as $-1$, $-0.5$, $-3/2$. It is also possible that there are a plurality of layout related parameters closely related to the occurrence of faults.

In this case, assuming A, B, C, ... to be amounts of mutually different layout related parameter information, x, y, z, ... to be weighting powers of the layout related parameter information, and $\alpha$, $\beta$, $\gamma$, ... to be weighting amount between layout related parameter information, the amount of the weighted layout related parameter information may be formulated as, for example, $\alpha A^x + \beta B^y + \gamma C^z + \ldots$, or $(\alpha A)^x + (\beta B)^y + (\gamma C)^z + \ldots$ Referring then to FIGS. 3A, 3B, 3C, FIGS. 4 and 5, a fourth embodiment is described below. In the fourth embodiment, a specific example of a method of dividing the regions on the layout corresponding to the logic connection nodes, for the purpose of weighting these nodes, is described.

From the layout regions corresponding to the logic connection nodes, the amount of the layout related parameter information related closely to the occurrence of a fault assumed in each connection node is extracted, and used as the weighting amount of the fault assumed in the logic connection node.

Figure 3A:
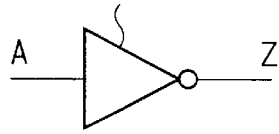
Figure 3B:
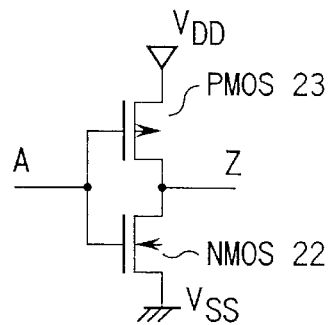
Figure 3C:
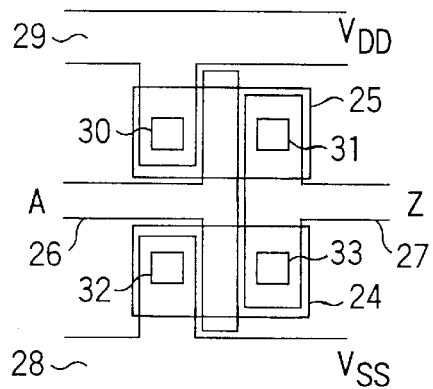

In FIGS. 3A, 3B, 3C, relating to an example of CMOS inverter, logic connections of gate level, device level, and pattern layout level are illustrated.

In the logic connection of gate level shown in FIG. 3A, an inverter 21 is a basic cell, and the logic symbol of the inverter is shown, but since this logic symbol usually describes only partial layout information such as gate width of the transistor and interconnection length in the cell, aside from input terminal A and output terminal Z, and therefore sufficient weighting information for input terminal A and output terminal Z cannot be obtained by this only.

However, in the logic connection of device level of CMOS inverter shown in FIG. 3B, the portion up to each input gate of NMOS 22 and PMOS 23 corresponds to the input terminal A, and the other portion corresponds to the output terminal Z, and considering the ease of occurrence of fault of each, the weighting information can be obtained.

Next, the layout regions corresponding to the input terminal A and output terminal Z to be weighted are divided. From the divided regions, the information useful for weighting the faults to be assumed at the input terminal A and output terminal Z is extracted as layout related parameter information according to a predetermined rule. From the amount of the layout related parameter information thus extracted, the weighting amount of the faults to be assumed at the input terminal A and output terminal Z are determined.

Relating to an example of pattern layout of the CMOS inverter shown in FIG. 3C, the relationship between pattern layout and weighting of assumed fault will be more specifically described. The CMOS inverter in FIG. 3C is composed of NMOS formation region 24, PMOS formation region 25, gate electrode 26, drain electrode 27, VSS source line 28, and VDD power source line 29.

Contacts 30, 31 are contacts for connecting the source region and drain region of PMOS with VDD power source line 29 and drain electrode 27, respectively. Contacts 32, 33 are contacts for connecting the source region and drain region of NMOS with VSS source line 28 and drain electrode 27, respectively.

As shown in FIG. 3C, for example, when an open fault occurs in the contacts 30, 32, although the defective position is positioned at the input terminal A side from the NMOS and PMOS gate 26 in layout, it is a fault belonging to the output terminal Z.

At this time, if the regions of the input terminal side and output terminal side are divided at the position in the layout, this open fault contributes to weighting of fault of the input terminal A, which is evidently not reasonable in the circuit function.

Therefore, basically, the portions corresponding to the input terminals and output terminals of each basic cell for assuming faults are divided according to the logic connection of device level, and the amount of layout related parameter relating to weighting of assumed faults should be estimated on the pattern layout. Generally, in the case of a basic cell composed of a plurality of logic gates or devices, the amount of layout related parameter information (pattern layout portion) corresponding to faults in the basic cell equivalent to the fault assumed at the output terminal of the basic cell should correspond to the weighting amount (basic cell internal portion) of the fault corresponding to the output terminal of the cell.

In the layout pattern, positions likely to cause defects are not always present in spots, but may occur randomly depending on, for example, the length along a gate, or if there is a problem in the gate insulation layer, they may also occur randomly depending on the gate area. Therefore, weighting of node is executed not only by counting the number of positions likely to cause faults or defects on the pattern layout, but also by extracting various types of information different in the dimension relating to occurrence of faults or defects, inclusively according to a specified rule as explained above by using numerical expressions.

As stated earlier, the status and the probability of fault occurrence classified by a fault mode are often analyzed preliminarily by using the process TEG or the like, and when they are used for weighting of a fault assumed in each logic connection node as the amounts of layout related parameter information, a weighted fault list closely related to the fault mode in the actual manufacturing process may be obtained.

Figure 4:
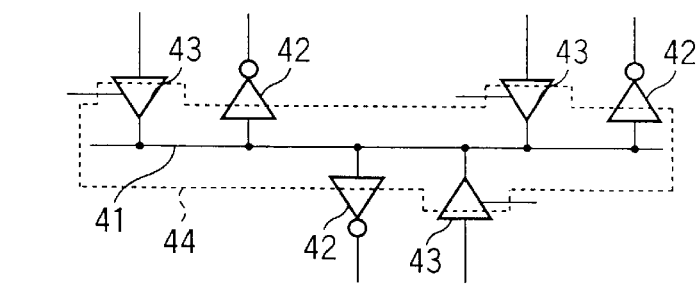
FIG. 4 is a diagram showing a dividing manner of region corresponding to logic connection node of bidirectional wiring.

Referring now to FIG. 4, a method of setting node regions in a bidirectional wiring 41 is described. Reference numeral 42 is an inverter having the input side connected to the bidirectional wiring 41, and 43 is a tri-state buffer having the output side connected to the bidirectional wiring 41. Herein, the tri-state buffer is a buffer circuit having a high impedance (hi-Z) state, aside from high level and low level, as output states.

The bidirectional wiring 41 forms one logic connection node, and the region for extracting a fault in relation to this logic connection node is considered to be a bidirectional wiring region 44 enclosed by broken line. The broken line crossing the inverter 42 and tri-state buffer 43 shows the division of the layout pattern into the regions of the input gate side and other regions by using the logic connection of device level conceptually on the logic symbol of gate level as explained in FIG. 3B.

Therefore, the region for extracting the weighting amount of fault about the bidirectional wiring 41 shown in FIG. 4 is the region on the pattern layout corresponding to the bidirectional wiring region 44 enclosed by broken line in FIG. 4. At this time, the constitution of the CMOS type tri-state buffer as seen from the output terminal side is same as the CMOS type inverter, and therefore the boundary of the layout region belonging to the input terminal and the layout region belonging to the output terminal may be set according to the examples in FIGS. 3B and 3C.

Figure 5A:
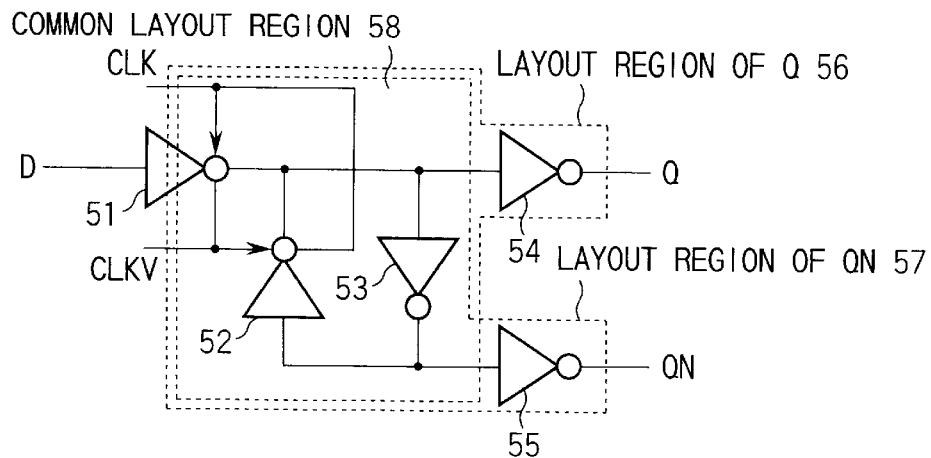

What must be noted here is that the circuit portions relating to plural output terminals of the basic cell are mutually overlapped. For example, a latch circuit is shown in FIG. 5A. The latch circuit in FIG. 5A is composed of an input side clocked inverter 51, a clocked inverter 52 for forming an inner loop for data holding, an inverter 53, and output side inverters 54, 55. Incidentally, CLK and CLKV are clock signals mutually inverted in phase, and the clocked inverter works as an inverter when the input signal indicated by arrow is "1", and produces a hi-Z output when "0".

At this time, it may be seen that the layout region corresponding to output terminals Q, QN is appropriate to be defined basically as the region enclosed by broken lines 56, 57, but in this case it must be noted that there is a common layout region 58 in the output terminals Q, QN.

That is, if the layout region corresponding to the output terminals Q, QN is defined to be the region enclosed by the broken lines 56, 57, the layout region 58 common to both is counted double, which is inconvenient.

Figure 5B:
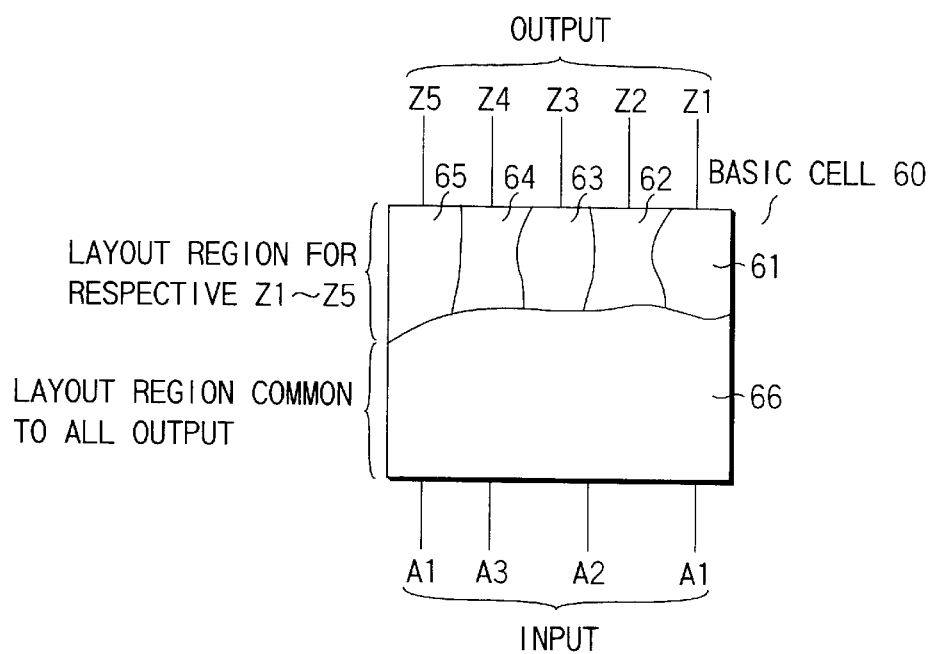

This situation is generally shown in FIG. 5B. In a basic cell 60 having input terminals A1 to A4 (regions corresponding to A1 to A4 are omitted here for simplicity), and output terminals Z1 to Z5, reference numeral 66 is a layout region common to all output terminals, and 61 to 65 are layout regions corresponding individually to output terminals Z1 to Z5.

If a fault relating to any one of output terminals Z1 to Z5 is detected, the layout related parameter is extracted from the common layout region 66, and individual layout region of the fault, and afterward when a fault relating to other output terminal is detected, the layout related parameter must be extracted to an individual layout portion of other output terminal. It is the same when a fault relating to a further different output terminal is detected.

Such dividing manner is means for avoiding double extraction from the common layout region 66, but no particular inconvenience occurs, in the software processing, by finding a common region and a unique region relating to each output terminal preliminary to fault simulation, and determining the final layout region corresponding to the result of fault simulation.

Figure 6A:
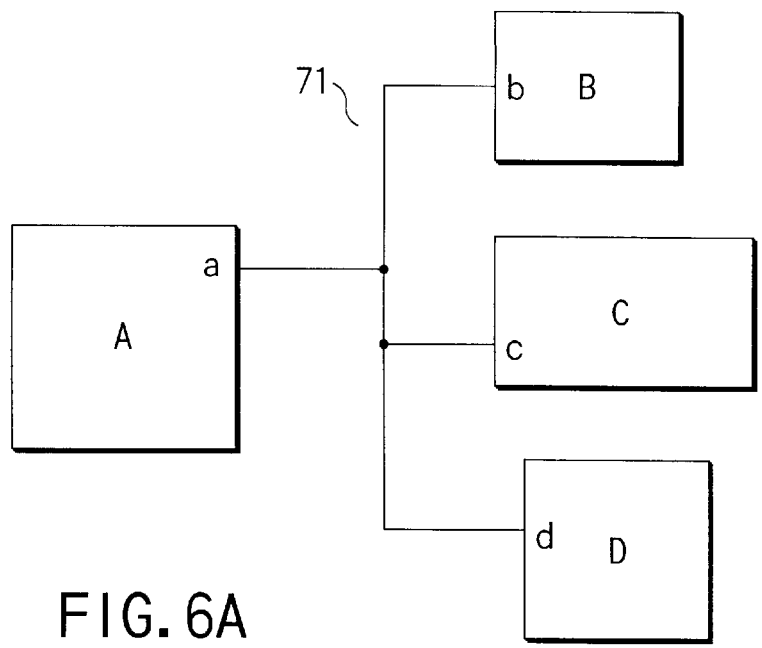
Figure 6B:
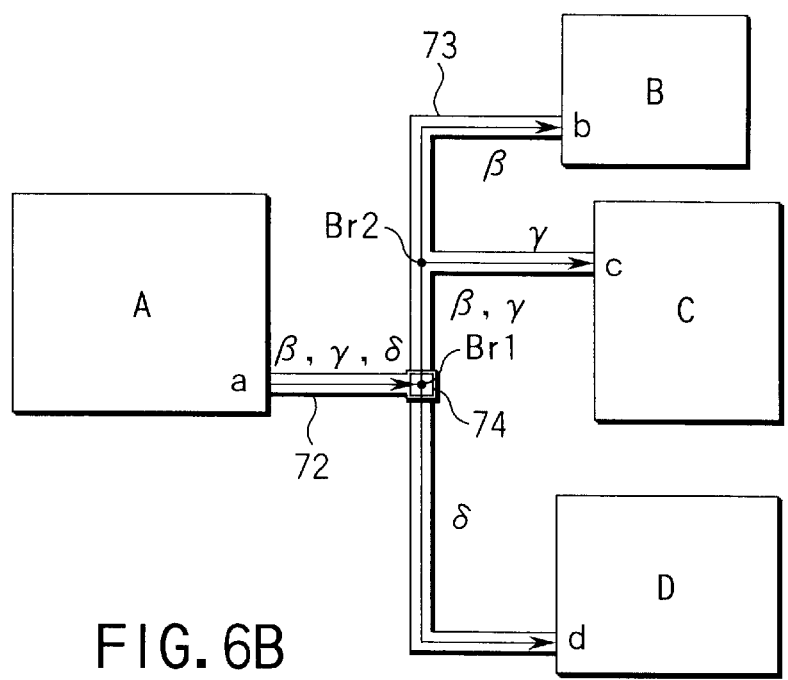

FIGS. 6A and 6B shows a manner of finding layout related parameter information assuming a fault in an input terminal of a basic cell inside a logic circuit. As shown in FIG. 6A, suppose the output from output terminal (a) of basic cell A is connected to input terminals (b), (c), (d) of basic cells B, C, D through a wiring 71.

This is a connection diagram at logic connection level. At this time, it is required to determine the layout related parameter amount in the portion of the wiring 71 corresponding to faults (respectively expressed as β, γ, δ) assumed in input terminals (b), (c), (d) of the basic cells B, C, D. FIG. 6B shows an example of this wiring portion realized in an actual layout. The terminal (a) of basic cell A is connected to a second layer Al wiring 72, and input terminals (b), (c), (d) of other basic cells B, C, D are connected to a first layer Al wiring 73.

These two layers of Al wiring are connected through a contact 74, and a signal is supplied from the output terminal (a) of the basic cell A to input terminals (b), (c), (d) of the basic cells B, C, D. Herein, when the unit of the layout information related to the connection wiring is generally expressed by a directional line until a first branch occurs, there are two branch points Br1, Br2 in the wiring of FIG. 6B. Seeing from the side of faults β, γ, δ assumed in input terminals (b), (c), (d), as shown in FIG. 6B, the following is known.

From terminal (a) to Br1 (including contact 74): Common to β, γ, δ

From Br1 to Br2: Common to β, γ

From Br2 to terminal (b): Related to β only

From Br2 to terminal (c): Related to γ only

From Br1 to terminal (d): Related to δ only

Hence, handling of the common portion existing above is same as the concept explained in FIG. 5B relating to the basic cell, and it may be applied in connection wiring between basic cells. As clear from comparison of FIGS. 6A and 6B, connection at logic connection level may not be possibly same as the connection at the layout level since the connection wiring 71 is basically processed as a single one at logic connection level.

Thus, depending on the manner of assuming faults (in this case, the assumed faults at terminals of different connection destinations are assumed to be different), it must be noted that it may be necessary to determine the amount of the layout related parameter information on the basis of the correct (actual) connection information in the layout.

The present invention is not limited to the illustrated embodiments alone. In the first to fourth embodiments, the fault detection information list obtained from the conventional fault simulation is weighted, but it is not always necessary to use the fault simulation result. For example, when the output of the ATPG is given as the test patterns 6 of FIG. 1, similarly, the output information including the weighted fault coverage and others of the present invention may be obtained. In the embodiments, the basic cell is explained, but it may be similarly executed by replacing the basic cell with a circuit block. Besides, various modifications are possible within a range not departing from the spirit and scope of the present invention.

As mentioned above, according to the evaluation device and evaluation method of fault coverage of the present invention, in the large scale integration such as system LSI, results of fault simulation may be truly utilized in improvement of quality in the manufacturing field.

That is, faults assumed in logic connection nodes of the circuit to be tested, and input terminals of each basic cell of inside and output terminals of each basic cell are weighted in relation to various data extracted from the actual layout data, and the weighted fault coverage is calculated from results of conventional fault simulation, and therefore it is possible to obtain the fault coverage of test patterns for faults or defects of high occurrence with high precision at the early stage of mass production of LSI products in which overlooking of defective products is most likely to occur.

In addition, the test patterns may be easily added so that the weighted fault coverage may be sufficiently high, and the product quality can be enhanced efficiently, so that the probability of shipping defective chips to customers may be effectively lowered by a far small investment in resources than in the prior art.

If a defective product is shipped to market, by fault analysis of returned sample, the defect mode can be analyzed, and the layout related parameter strongly related to the defect mode can be extracted, and the fault simulation result is reviewed by weighting according to such parameter, and by adding the test pattern so as to enhance the weighted fault defect rate, shipping of products containing similar defect mode to the market can be promptly prevented.

The present invention may be similarly utilized not only when preparing the test pattern manually, but also when preparing test patterns contributing greatly to the manufacturing quality improvement by ATPG.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An evaluation device of fault coverage comprising:
   a weighted fault list generator for outputting a weighted fault list of a logic circuit by receiving input information, that is,
   logic connection information of the logic circuit wherein a fault is set,
   layout information of the logic circuit, and
   layout related parameter information to be extracted from the layout information related to the fault determined from the logic connection information of said logic circuit,
   wherein said weighted fault list includes a weighted fault generated by weighting said fault with said layout related parameter information.

2. The evaluation device of fault coverage of claim 1, wherein the fault obtained from the logic connection information is at least composed of the fault set in the logic connection node for connecting the input and output terminals of the basic cell inside the logic circuit, input terminal of the basic cell inside the logic circuit, or the output terminal of the basic cell inside the logic circuit.

3. The evaluation device of fault coverage of claim 1, further comprising a calculator for weighted fault coverage and others for outputting at least the weighted fault coverage of the logic circuit and weighted detected and undetected fault list by receiving the weighted fault detection information list of the logic circuit obtained from a fault simulation for the weighted fault list as input information.

4. The evaluation device of fault coverage of claim 1, further comprising a calculator for weighted fault coverage and others for outputting at least the weighted fault coverage of the logic circuit and weighted detected and undetected fault list by receiving the weighed fault detection information list of the logic circuit obtained from an ATPG for the weighted fault list as input information.

5. The evaluation device of fault coverage of claim 1, wherein a weight of each fault includes at least one of being unique for the fault and being common to other faults.

6. An evaluation device of fault coverage comprising:
a weighted fault list generator for outputting a weighted fault list of a logic circuit by receiving input information, that is, logic connection information of the logic circuit wherein a fault is set, layout information of the logic circuit, a fault list including faults obtained from the logic connection information of said logic circuit, and set in the logic connection information, and layout related parameter information to be extracted from the layout information related to the fault, wherein said weighted fault list includes a weighted fault generated by weighting said fault with said layout related parameter information.

7. The evaluation device of fault coverage of claim 6, wherein the fault obtained from the logic connection information is at least composed of the fault set at the logic connection node for connecting the input and output terminals of the basic cell inside the logic circuit, input terminal of the basic cell inside the logic circuit, or the output terminal of the basic cell inside the logic circuit.

8. The evaluation device of fault coverage of claim 6, further comprising a calculator for weighted fault coverage and others for outputting at least the weighted fault coverage of the logic circuit and weighted fault detection information list by receiving, as the input information, the fault detection information list of the logic circuit obtained by executing fault simulation by receiving, as the input information, logic connection information of the logic circuit, the fault list, and test patterns applied to the logic circuit.

9. The evaluation device of fault coverage of claim 6, further comprising a calculator for weighted fault coverage and others for outputting at least the weighted fault coverage of the logic circuit and weighted fault detection information list by receiving, as the input information, the fault detection information list of the logic circuit obtained by using an ATPG by receiving, as the input information, logic connection information of the logic circuit and the fault list.

10. The evaluation device of fault coverage of claim 6, wherein a weight of each fault includes at least one of being unique for the fault and being common to other faults.

11. An evaluation method of fault coverage comprising the steps of:

outputting a weighted fault list by inputting logic connection information of a logic circuit, layout information of the logic circuit, and layout related parameter information to be extracted from the layout information related to a fault determined from the logic connection information of said logic circuit, into weighted fault list generation means, outputting a weighted fault detection information list of the logic circuit obtained by executing a fault simulation by receiving the logic connection information of the logic circuit, the weighted fault list, and test patterns applied to the logic circuit as input information, and outputting weighted fault coverage and undetected fault analysis information at least to the logic circuit by inputting the fault detection information list to calculating means for weighted fault coverage and others.

12. The evaluation method of fault coverage of claim 11, wherein the test patterns and the fault detection information list are obtained by executing ATPG for the logic circuit.

13. The evaluation method of fault coverage of claim 11, wherein the fault obtained from the logic connection information is at least composed of the fault set at the logic connection node for connecting the input and output terminals of the basic cell inside the logic circuit, input terminal of the basic cell inside the logic circuit, or the output terminal of the basic cell inside the logic circuit.

14. The evaluation device of fault coverage of claim 11, wherein a weight of each fault includes at least one of being unique for the fault and being common to other faults.

15. An evaluation method of fault coverage comprising the steps of:

outputting a weighted fault list by inputting logic connection information of a logic circuit, layout information of the logic circuit, a fault list of faults determined from the logic connection information of said logic circuit and layout related parameter information to be extracted from the layout information related to the fault, into weighted fault list generation means, outputting a fault detection information list of the logic circuit obtained by executing a fault simulation by receiving the logic connection information of the logic circuit, the fault list, and test pattern corresponding to the logic circuit as input information, and outputting weighted fault coverage and undetected fault analysis information at least to the logic circuit by inputting the fault detection information list and the weighted fault list to calculating means for weighted fault coverage and others, wherein said weighted fault list includes a weighted fault generated by weighting said fault with said layout related parameter information.

16. The evaluation method of fault coverage of claim 15, wherein the test patterns and the fault detection information list are obtained by executing ATPG for the logic circuit.

17. The evaluation method of fault coverage of claim 15, wherein the fault obtained from the logic connection information is at least composed of the fault set at the logic connection node for connecting the input and output terminals of the basic cell inside the logic circuit, input terminal of the basic cell inside the logic circuit, or the output terminal of the basic cell inside the logic circuit.

18. The evaluation device of fault coverage of claim 15, wherein a weight of each fault includes at least one of being unique for the fault and being common to other faults.

* * * * *

UNITED STATES PATENT AND TRADEMARK OFFICE
CERTIFICATE OF CORRECTION

PATENT NO.   : 6,567,946 B1
DATED        : May 20, 2003
INVENTOR(S)  : Nozuyama

It is certified that error appears in the above-identified patent and that said Letters Patent is hereby corrected as shown below:

<u>Column 12,</u>
Line 62, change "weighed" to -- weighted --.

Signed and Sealed this

Second Day of September, 2003

JAMES E. ROGAN
*Director of the United States Patent and Trademark Office*